United States Patent
Robichaux et al.

(10) Patent No.: US 7,579,799 B2
(45) Date of Patent: Aug. 25, 2009

(54) SYSTEM AND METHOD FOR DETERMINING ANGULAR POSITION AND CONTROLLING ROTOR ORIENTATION

(75) Inventors: Jerry D. Robichaux, Tucson, AZ (US); John F. Bugge, Tucson, AZ (US); Charles De Lair, Pomerene, AZ (US); Eric M. Lafontaine, Simpsonville, SC (US)

(73) Assignee: Raytheon Company, Waltham, MA (US)

( * ) Notice: Subject to any disclaimer, the term of this patent is extended or adjusted under 35 U.S.C. 154(b) by 400 days.

(21) Appl. No.: 11/623,810

(22) Filed: Jan. 17, 2007

(65) Prior Publication Data
US 2007/0176568 A1    Aug. 2, 2007

Related U.S. Application Data

(60) Provisional application No. 60/759,464, filed on Jan. 17, 2006.

(51) Int. Cl.
*H02P 6/16* (2006.01)

(52) U.S. Cl. .............................. 318/400.38; 318/400.01

(58) Field of Classification Search ................. 318/605, 318/700, 400.01, 400.16, 400.23, 400.24, 318/400.37, 400.38
See application file for complete search history.

(56) References Cited

U.S. PATENT DOCUMENTS

| | | | | |
|---|---|---|---|---|
| 5,352,962 A | * | 10/1994 | Galburt | 318/687 |
| 5,659,230 A | * | 8/1997 | Fukuoka | 318/400.04 |
| 5,723,957 A | * | 3/1998 | Ishikawa | 318/400.2 |
| 6,084,376 A | | 7/2000 | Piedl et al. | |
| 6,693,422 B2 | | 2/2004 | Lutz | |
| 6,744,230 B2 | * | 6/2004 | Hill et al. | 318/400.04 |
| 6,806,669 B2 | * | 10/2004 | Griesemer et al. | 318/434 |
| 6,931,918 B2 | | 8/2005 | Herb | |
| 2004/0080290 A1 | * | 4/2004 | Hill et al. | 318/254 |
| 2005/0248306 A1 | * | 11/2005 | Chen et al. | 318/712 |

* cited by examiner

*Primary Examiner*—Bentsu Ro
(74) *Attorney, Agent, or Firm*—Ingrassia Fisher & Lorenz, P.C.

(57) ABSTRACT

Methods and devices for determining the position and/or angular orientation of a rotating shaft. Exemplary features include a sensor module and a position determination module. Sensor module may include a plurality of Hall Effect devices (HEDs) arranged at a specified angular separation to produce a signal in response to rotation of the shaft. Position module may be responsive to sensor module to produce a converted signal, determine an error term, and produce a position estimate. Converted signal may be produced by processing the HED signals into sinusoidal reference signals having offset scale and amplitude scale factors. Error term may be determined by processing the converted signals to produce an estimated position signal. Position estimate may be produced by processing the error term. Refined position measurement may be achieved by iterative elimination of regressive differences between position estimates with minimization of absolute magnitude of error term.

23 Claims, 4 Drawing Sheets

SYSTEM AND METHOD FOR DETERMINING ANGULAR POSITION AND CONTROLLING ROTOR ORIENTATION

RELATED APPLICATIONS

This application claims the benefit of U.S. Provisional Patent Application No. 60/759,464 (filed on Jan. 17, 2006) entitled "System And Method To Use Linear Hall Effect Devices For Determining Angular Position For High Performance Servo Control".

FIELD OF INVENTION

The present invention generally concerns systems and methods for measuring or actuating angular position in rotating systems; and more particularly, representative and exemplary embodiments of the present invention generally relate to systems, devices and methods for the determination and control of the angular position or orientation of a rotor assembly.

BACKGROUND OF INVENTION

Servomechanisms are generally implemented across a broad spectrum of industries. Such devices typically make use of a sensor to produce output in response to movement of a rotor shaft and a microprocessor to convert the sensor output into a useful metric. In particular, the sensor featured in such applications may include a potentiometer, an optical encoder, and/or a resolver.

Electric motors that require controlled armature current waveforms (in order to rotate smoothly, for example) also require accurate rotor position sensing. Some motors use sensorless technologies, but these technologies generally do not provide accurate rotor position sensing at low speeds and are not smooth on startup of the motor. Other motors are not adapted to utilize sensorless technologies and must incorporate a rotor position sensing mechanism. Conventional motors typically use either an encoder or a resolver in conjunction with associated electronic circuitry to determine rotor positions. Depending on the resolution required, these solutions may be prohibitively expensive within applications that require low cost motors.

Many electric motor applications generally require smooth rotation and/or accurate control. Brushless motors typically achieve this by using 3-phase, sine-wave commutation and accurate rotor position detectors, usually in the form of an encoder or a resolver. The accurate rotor position detector generally operates to ensure that the sine wave remains synchronized with the rotor, thus avoiding commutation-induced torque ripple. Conventional methods used for accurately detecting rotor positions usually employ encoders and resolvers.

Encoders sense mechanical motion and translate the sensed motion into electrical signals, of which optical encoders are the most common type. An optical encoder typically includes a housing to support precision bearings and electronics, a shaft with a sensing disc having alternating clear and opaque segments, a light emitting diode (LED), and a photo transistor receiver. A beam of light produced by the LED is aimed at the optical disc. When the optical disc rotates, the light beam passes through the clear segments but is blocked by the opaque segments so that the optical disc effectively pulses the light beam. The pulsed light beam is received by the photo transistor receiver. The photo transistor receiver and the circuitry inside the encoder together provide signal to a motor controller outside the encoder and can also perform functions such as improving signal/noise. Encoders in their simplest form have one output to determine the shaft rotational speed or to measure a number of shaft revolutions. Other encoders have two outputs and can provide direction-of-rotation information as well as speed and number of revolutions. Still other encoders provide an index pulse which indicates absolute rotor position. The description thus far relates specifically to incremental encoders, which upon startup, the absolute position of the encoder is not known.

A second type of encoder, called an absolute encoder, has a unique value for each mechanical position throughout a rotation. These units typically consist of the incremental encoder described above with the addition of another signal channel that serves to generate absolute position information, typically with diminished accuracy. For an absolute encoder that is provided with an index pulse, the accuracy improves once the rotor traverses the index pulse. Incremental encoders may be acceptable within asynchronous motors, where speed feedback is important. Absolute encoders may be desirable in synchronous motor applications, where both position and speed feedback are important.

Another class of high resolution encoders is that of sine/cosine encoders, which generate sine and cosine signals rather than pulse waveforms. When used with additional electronic components, processor capability and software, sine/cosine encoders indicate rotor position with fine resolution.

In general terms, encoders of all types are precision built, sensitive devices that must be mechanically, electrically and optically matched and calibrated. Resolvers, on the other hand, typically provide one signal period per revolution and are known to he highly tolerant of vibration and temperature variation. A typical use of this technology may include a resolver generating two signals, both a sine-wave signal and a cosine-wave signal, for each revolution. An advantage of using resolvers is that they provide absolute rotor position information, rather than incremental information as is typically the case with most encoders. One disadvantage of resolvers is that they operate on the principle of inductive coupling of magnetic fields which are modulated and subsequently demodulated into sine and cosine components. The processes involved with coupling the magnetic fields and modulation and demodulation limit the resolver's useful speed range. As with encoders, resolvers are precision built, commercially available sensing devices that may be fragile and expensive, requiring complex encoding/decoding circuitry and bulky and heavy magnetic components.

Ring magnets and digital Hall effect sensors are often used as rotor position sensing mechanisms within brushless direct current (DC) motor applications where square-wave or six-step drive is used. This method of sensing provides low resolution, typically six position steps per electrical cycle when using three sensors. Six-step drive generally does not require high resolution rotor position sensing. At the same time, these drive methods do not generally provide ripple-free torque from the motor. This may be unacceptable in a variety of applications.

U.S. Pat. No. 6,522,130 is drawn to a device for sensing rotor position and detecting rotational speed over a broad range of electric motor speeds with analog Hall effect sensors. That notwithstanding, the structural design requires the addition of a sensor ring, and does not describe the process for estimating rotor position. Thus, the approach described therein does not lend itself to scalable applications in terms of device dimensions, placement of sensors, accuracy of angular measureiment—and notably—the discrete hardware implementation of obtaining angular position data.

While useful in certain applications, conventional servomechanism sensing and control devices have a number of disadvantages, including, for example, the inherent volume exclusion of the devices themselves, ease of manufacture, cost and accuracy of angular position measurements. These characteristics tend to limit the design flexibility and commercial feasibility of conventional sensor systems.

SUMMARY OF THE INVENTION

In various representative aspects, the present invention provides methods and devices for determining the position and/or angular orientation of a rotating shaft. Exemplary features generally include a sensor module, a position determination module, and an optional control module. The sensor module may comprise a plurality of analog type Hall Effect Devices (HEDs) arranged with a predetermined angular separation. The sensor module may be suitably configured to produce a signal in response to rotation of the rotor shaft. The position determination module may be suitable configured to respond to the sensor Module to produce a rotational position estimate.

Advantages of the present invention will be set forth in the Detailed Description which follows and may be apparent from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the detailed description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the term "first", "second", and the like herein, if any, are used inter alia for distinguishing between similar elements and not necessarily for describing a sequential or chronological order. Moreover, the term "front", "back", "top", "bottom", "over", "under", "forward", "aft", and the like in the Description and/or in the claims, if any, are generally employed for descriptive purposes and not necessarily for comprehensively describing exclusive relative position. Any of the preceding terms so used may be interchanged under appropriate circumstances such that various embodiments of the invention described herein, for example, may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventors' conception of the best inode, and are not intended to limit the scope, applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

Various representative implementations of the present invention may be applied to any system for the determination of position and/or angular orientation of a rotating shaft. Certain representative implementations may include, for example: robotic devices; aerospace actuators; machine tools; automotive applications, such as electronic throttle and antilock braking systems; electronic seat and door actuation; control systems; and/or the like.

As used herein, the term "actuation input" (including any contextual variant thereof) is generally intended to include anything that may be modified to adjust the properties of a rotating shaft (e.g., a rotor), such as, for example, adjusting at least one of voltage and current within the windings of an electric motor, and/or the like.

As used herein, the term "arranged" (including any contextual variant thereof) is generally intended to describe the placement of a structure in a particular position, such as, for example, soldering a HED to a circuit card and affixing the circuit card a specified distance from a rotating shaft, and/or the like.

As used herein, the term "HED" or "Hall Effect Device" (including any contextual variant thereof) is generally intended to describe a Hall Effect Device or any other semiconductor device that may be used to produce a signal in response to incident magnetic flux, and/or the like.

As used herein, the term "processing" (including any contextual variant thereof) is generally intended to describe the manipulation of information according to an algorithm, such as, for example: modification of an electric signal by an AND gate; modification of an electric signal by an OR gate; and/or the like.

As used herein, the term "responsive to" (including any contextual variant thereof) is generally intended to describe the relationship between two elements in which the output of one element may be received by the other element, such as, for example: a HED positioned to produce a signal in response to incidence with magnetic flux; a processor configured to receive the signal produced by an HED; and/or the like.

As used herein, the term "signal" (including any contextual variant thereof) is generally intended to describe a quantifiable transmission of information, such as, for example: a voltage, a current, a measurement of magnetic flux, and/or the like.

As used herein, the term "specified" (including any contextual variant thereof) is generally intended to describe an arrangement of a structure or a quality or discrete value of a phenomenon conforming to a design parameter, such as, for example: a plurality of HEDs positioned at 90 degree electrical separation, a voltage above a discrete threshold voltage, and/or the like.

A detailed description of an exemplary application, namely an actuation control system for a motor, is provided as a specific enabling disclosure that may be generalized to any application of the disclosed system, device and method for determining, controlling or otherwise observing or manipulating the position and/or angular orientation of a rotor in accordance with various exemplary embodiments of the present invention.

In various representative embodiments in accordance with the present invention, a control system for a motor may include a sensor module, a position determination module, and a control system module. For example, a sensor module may comprise a plurality of HEDs arranged to produce a signal in response to incident magnetic flux corresponding to rotation of a rotor shaft. The position determination module may be configured to receive sensor module output and process the data to produce a processed (e.g., converted) signal. The control system module may be configured to receive the processed signal and modify at least one actuation input of the motor in accordance with a desired rotational conformation.

Figure 1:
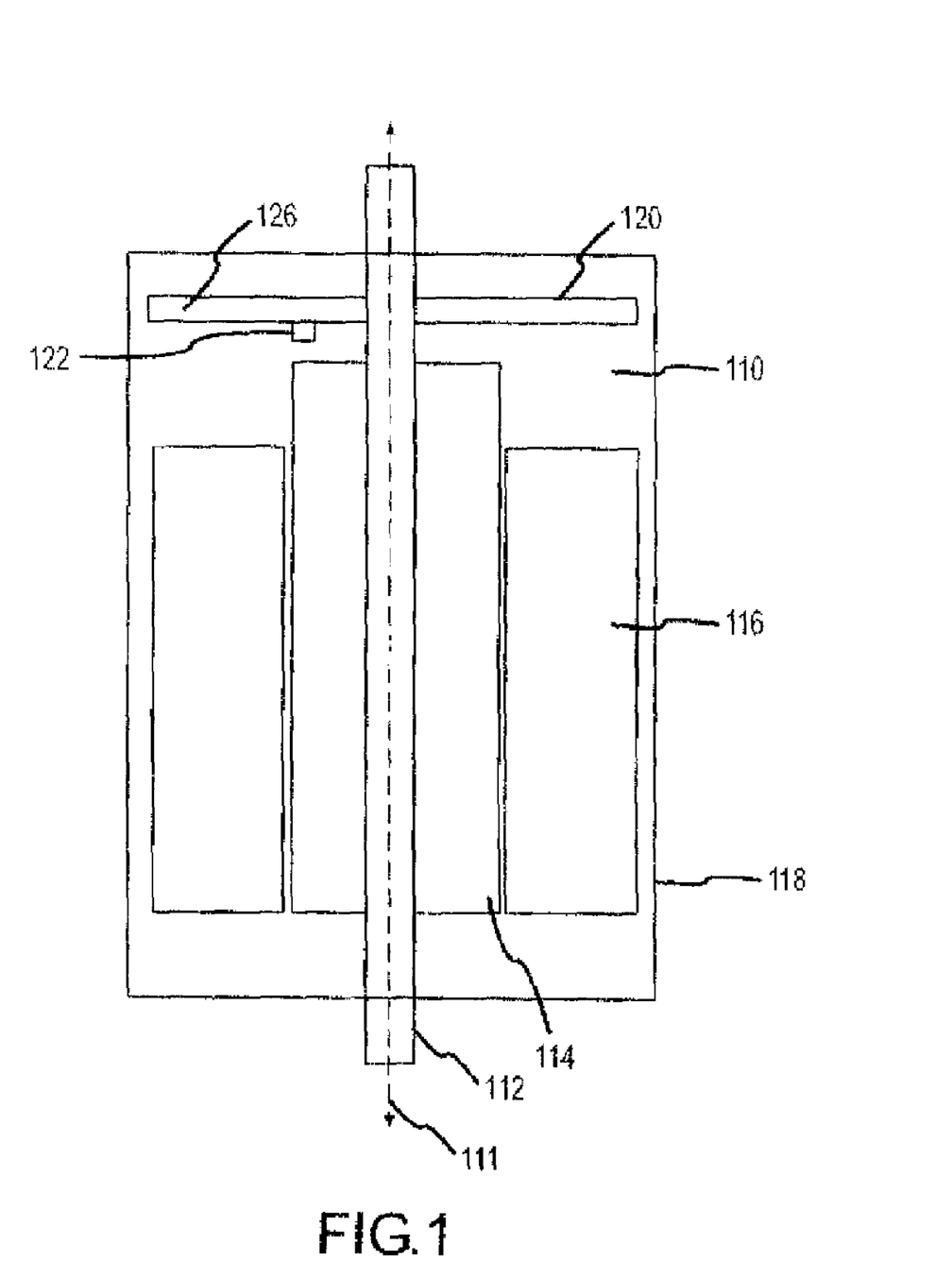
FIG. 1 representatively illustrates a motor (110) with a sensor module (122) in accordance with an exemplary embodiment of the present invention.

As generally depicted in FIG. 1, a representative embodiment 100 of the present invention provides a side view of motor 110 and circuit card 120 in which the circuit card 120 is configured to produce a signal in response to a change in the rotational position of rotor 112. Motor 110 may comprise rotor shaft 112, motor field pole magnets 114, stator 116, and housing 118. Rotor shaft 112 may be configured to rotate about its principal axis 111 within housing 118 in response to the rotating magnetic field of stator 116 and the effect of this field on motor field pole magnets 114. Circuit card 120 may comprise a sensor module 122 coupled to circuit card body 126. Sensor module 122 may be configured to produce a signal in response to rotation of rotor shaft 112 and communicate this signal to a position determination module.

Motor 110 may be configured to convert electrical energy into kinetic energy. Alternatively, conjunctively or sequentially, motor 110 may be suitably configured to convert kinetic energy into electrical energy. Regardless of the implementation, variations in the rotations of rotor shaft 112 may be detected via a suitably configured sensor module 122.

Rotor shaft 112 may be configured to rotate about its principal axis 111 within the housing 118 in response to actuation of motor field pole magnets 114 by stator 116. Rotor shaft 112 may comprise a cylinder contained within housing 118 and constrained to movements about its principal axis 111. Rotor shaft 112 may be further coupled to transfer kinetic energy to and/or from other systems.

Field pole magnets 114 may be suitably configured in a variety of ways in accordance with various representative embodiments of the present invention. For example, motor field pole magnets 114 may comprise a plurality of radially magnetized permanent magnets. These magnets may be coupled to rotor shaft 112 and configured to rotate rotor shaft 112 about its principal axis 11 in response to forces imparted on motor field pole magnets 114 by stator 116. The forces imparted on motor field pole magnets 114 by stator 116 nay relate to the properties of a brushless permanent magnet motor 110, such as whether the motor is a synchronous or non-synchronous motor.

Motor field pole magnets 114 may be configured to have a length greater than that of stator 116. For example, field pole magnets 114 may be configured to substantially protrude from stator 116 when disposed within housing 118 such that the magnetic field of stator 116 diminishes in the direction of protrusion. For implementations in which sensor module 122 is positioned along the protruding surface of motor field pole magnets 114, the signal produced by sensor module 122 may be substantially isolated from the magnetic field of stator 116.

In a representative and exemplary embodiment, field pole magnets 114 may have a length parallel to the principal axis 111 of rotor shaft 112 equal to about 2.0 inches, whereas stator 116 may have a length along the principal axis 111 of rotor shaft 112 corresponding to about 1.75 inches. Accordingly, motor field pole magnets 114 may be suitably configured to protrude from about 0.25 inches with respect to stator 116.

Stator 116 may be configured to impart a force on motor field pole magnets 114 in any suitable manner, such as by variations in the voltage and/or current of stator 116. For designs in which motor field pole magnets 114 are comprised of permanent magnets, stator 116 may comprise field windings configured to produce a variable magnetic field.

Housing 118 may be configured contain both motor 110 and circuit card 120. For example, housing 118 may comprise a hollow cylindrical casing suitably configured to protect motor 110 and/or circuit card 120 from debris, such as dust and/or conductive particles, that may otherwise impair operation of motor 110 and/or circuit card 120. Housing 118 may be suitably configured to implement motor 110 within a specified operative environment, such as within an automobile, a robotics device, an aerospace application, and/or the like.

Circuit card 120 may be positioned near motor field pole magnets 114 such that the magnetic field of motor field pole magnets 114 produces a signal within with sensor module 122. Sensor module 122 may comprise one or more HEDs configured to produce signal(s) in response to incident magnetic flux of rotational motion of motor field pole magnets 114. As motor field pole magnets 114 rotate rotor shaft 112 about its principal axis 111, an analog HED may produce a sinusoidal signal in response to the changing magnetic field. For example, HED 122 may be configured to produce a maximum voltage corresponding to maximum strength of a north pole and a minimum voltage corresponding to maximum strength of a south pole.

A HED may be suitably configured to produce a specified signal. For example, an analog HED may be suitably configured to produce a substantially sinusoidal signal in response to incident magnetic flux having a periodic magnitude.

The distance between sensor module 122 and the source of magnetic flux may relate to the properties of sensor module 112 and the source of the magnetic flux. For example, at some distances from the magnetic flux source, a HED may saturate in operation and/or produce a distorted sinusoidal signal. As a further example, the field strength of the magnetic flux source may be too weak to induce a Hall Effect signal within the HED. Accordingly, the specified distance for arranging or otherwise disposing sensor module 122 relative to the magnetic flux source may be that distance at which the magnetic flux is low enough not to saturate the HED and/or high enough to produce a signal within the HED.

In a representative embodiment, sensor module 122 may comprise at least two analog HED sensors arranged at about 0.3 inches from the principal axis 111 of rotor shaft 112 and at about 0.01 to about 0.05 inches from the surface of motor field pole magnets 114, wherein the surface of motor field pole magnets 114 is substantially transverse with respect to the longitudinal axis 111 of rotor shaft 112. For any given representative embodiment of the present invention, the arrangement of sensor module 112 relative to the magnetic flux source may be influenced by factors such as the parameters of the HED, the strength of the magnetic field produced by motor held pole magnets 114, interference from stator 116, and/or the like.

The signal produced by sensor module 122 may be processed via a position determination module coupled to circuit card 120. Circuit card 120 may be coupled with other systems (or sub-systems) such as signal processing systems, actuation input systems, and/or the like, such that sensor module 122 embedded on circuit card 120 may transmit a signal to the other systems (or sub-systems).

The position module may comprise one or more processors embedded within circuit card 120 and/or responsive to sensor module 122, such as a microcomputer linked with sensor module 122 via conductive wire and/or a wireless circuit. For example, a signal produced by a HED may be processed by a position module to determine the position of rotor 112.

A HED may be suitably contained by or otherwise disposed on card body 126. For example, a HED may comprise a surface mount HED sensor soldered to an annular conductive element on card body 126. As a further example, a HED may comprise a through-hole that is set at an angle to motor field pole magnets 114. Design considerations may include the desired signal, the characteristics of motor field pole magnets 114, the characteristics of the HED, and/or the like.

Figure 2:
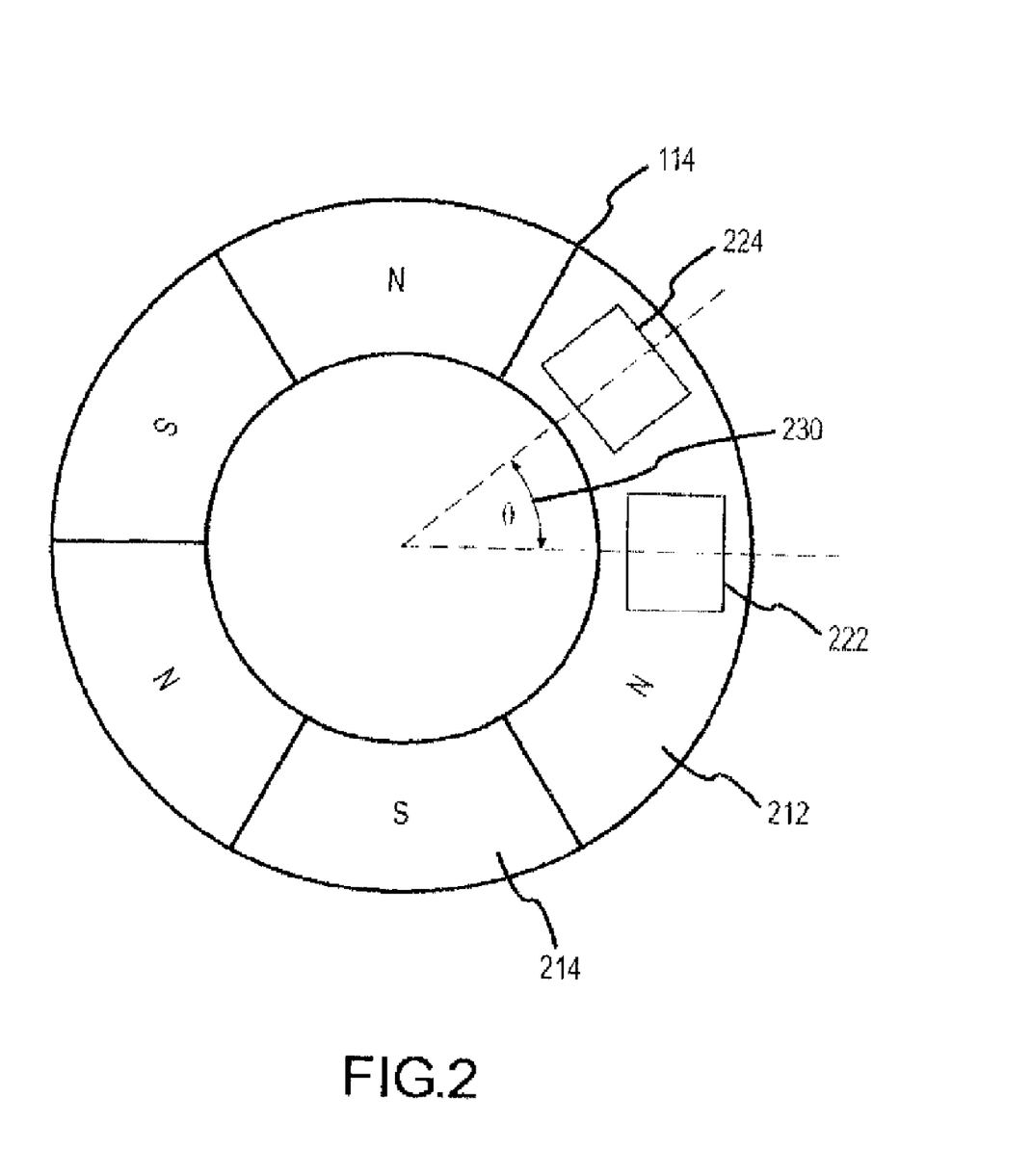
FIG. 2 representatively illustrates a plurality of analog type Hall Effect Device (HED) sensors (222, 224) disposed above a magnetized rotor assembly (114) in accordance with another exemplary embodiment of the present invention.

As generally depicted in FIG. 2, a representative embodiment of the present invention includes sensor modules 222, 224 arranged at a specified angle and distance from a surface of motor field pole magnets 114. Specifically, sensor modules 222, 224 may be arranged or otherwise disposed in relation to a surface of motor field pole magnets 114 substantially transverse to the longitudinal axis of the rotor shaft. In this configuration, HEDs 222/224 (i.e., sensor module elements) may be substantially unaffected by the phase currents produced by actuation of the rotor shaft via the stator. Accordingly, the signal produced by a HED 222/224 may be substantially resultant from rotation of the rotor shaft (and via direct coupling, motor field pole magnets 114) relative to HED sensor module elements 222, 224.

The sensor module may be suitably arranged along the transverse face of the rotor. For example, the location of a HED 222/224 may be varied to produce a specified sinusoidal voltage response. For a rotor comprising radially magnetized permanent magnets 212/214, the magnetic field strength along the transverse face may be strongest near the center of the magnetic face; that is, near the geometric center of a pole. Accordingly, the sensor module may be positioned near the center of the magnetic face.

A sensor module comprising more than two HEDs may also be considered. The HEDs may be spaced according to the number of magnetic poles constituting the magnetic flux source and/or according to the sinusoidal response of the signal produced by each HED. For example, for a rotor with six magnetic poles, a first HED may be positioned at 0 degrees and a second HED may be positioned at any multiple of 30 mechanical degrees. Factors such as the number of magnetic poles, the number of HEDs to be implemented, and/or the position determination algorithm may influence the arrangement or relative disposition of HEDs.

Figure 3:
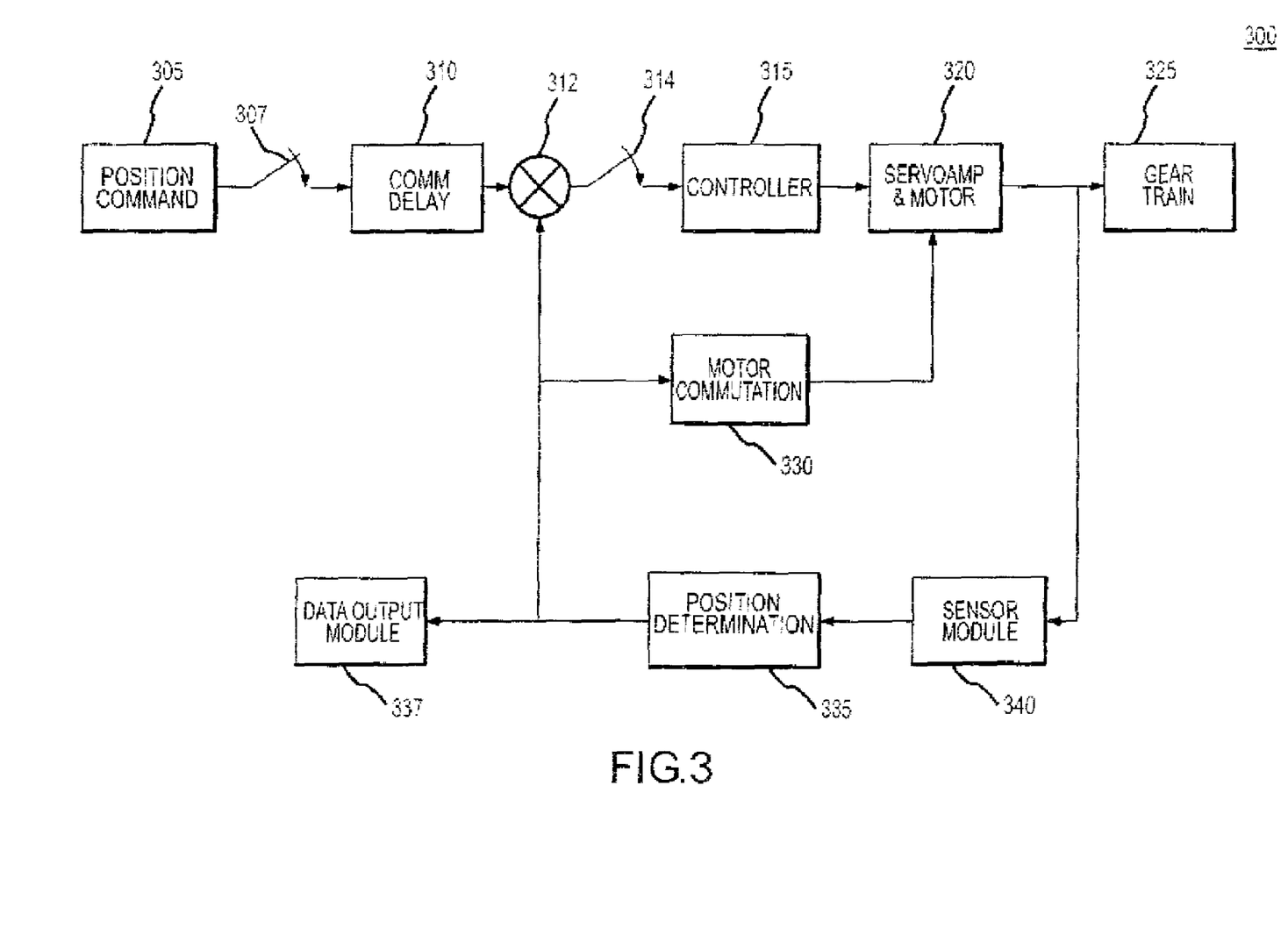
FIG. 3 representatively illustrates a block diagram for a motor (320) coupled to a control system in accordance with an exemplary embodiment of the present invention.

As representatively depicted in FIG. 3, an exemplary embodiment of the present invention 300 includes a motor 320 coupled to a controller 315. In one implementation, controller 315 may be suitably configured to actuate motor 320 according to a servo coupled to motor 320. Actuation of motor 320 may cause commutation of motor 320. Motor commutation may proceed in response to input from a position determination nodule 335. The output of position determination module 335 may be received by controller 315 for actuation of motor 320 over the next time interval. Gear train 325 may be actuated in response to actuation of motor 320.

In addition to motor commutation 330, position determination module 335 may be responsive to the output of sensor module 340. Sensor module 340 may be suitably configured to produce a signal in response to actuation of the motor 320. In such a configuration, controller 315 may actuate motor 320 in response to the output of position determination module 335, where position determination module 335 includes both information for motor commutation 330 and information from sensor module 340.

Further, controller 315 may be configured to actuate motor 320 in response to a signal from a command source module 305 with communications delay 310. Math operation 312 may be suitably configured to provide output to controller 315, taking into account output from position determination module 335 and output from command source module 305. Accordingly, motor 320 may be actuated according to output from position determination module 335, motor commutation 330, and/or controller 315. The output from processing of position determination module 335 and the signal from command source module 305 may be selectively provided to additional data output modules or sub-systems 337. Various switches 307, 314 represent discrete update rates and communication processes typical in microprocessor controlled systems.

Figure 4:
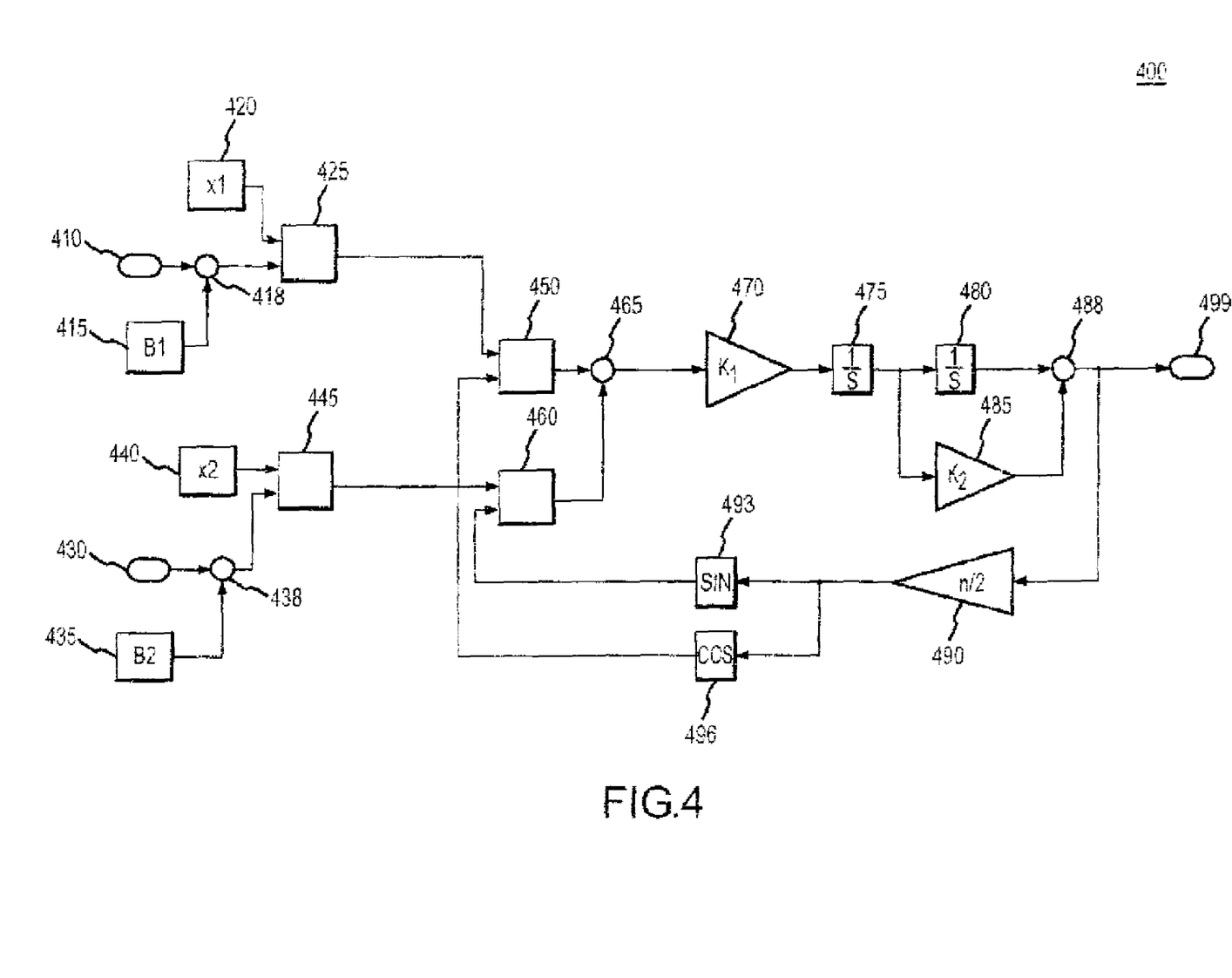
FIG. 4 representatively illustrates a block diagram for processing a plurality of sensor module Outputs (410, 430) via a recursive frequency domain function.

A representative embodiment of the position determination module 335 as shown in FIG. 3, is depicted in FIG. 4. The representative embodiment 400 provides a system for processing sensor module output via a recursive frequency domain function. A representative recursive frequency domain function may comprise the steps of producing a signal from a pair of HEDs, scaling the signals, and applying a mathematical error operator on the scaled HED signals and the previous estimated position in order to re-iterate the estimated position.

In a representative embodiment, sensor module may comprise a first HED and a second HED. The first HED may produce a first signal 410 and the second HED may produce a second signal 430. First signal 410 may be adjusted by an offset factor 415 and a scale factor 420. Likewise, second signal 430 may be adjusted by an offset factor 435 and a scale factor 440.

Processing of the first signal 410 and the second signal 430 may proceed in accordance with the following:

$$HED1\_Sin = (HED1\_V - B1) * X1 \text{ and } HED2\_Cos = (HED2\_V - B2) * X2,$$

where HED1_Sin is an offset and scaled sinusoidal representation of the first signal 410, HED1_V is the quantified first signal 410, B1 is the offset factor 415, X1 is the scale factor 420, HED2_Cos is an offset and scaled sinusoidal representation of the second signal 430, HED2_V is the quantified second signal 430, B2 is the offset factor 440, and X2 is the scale factor 435.

The offset and/or scaling may proceed according to a fixed offset factor 415/440 and/or scale factor 420/435. Alternatively, these factors 415/440/420/435 may be adaptively varied. For example, the offset 415/440 and/or scale factor 420/435 may be modified in response to a change in the temperature of the rotor shaft, the angular position of the rotor shaft, the angular acceleration of the rotor shaft, the angular velocity of the rotor shaft, the frequency of rotation of the rotor shaft, and/or the like. Adaptive modification of the offset 415/440 and/or scale factors 420/435 may be employed to optimize the motor position algorithm, and/or a subroutine thereof, for a given operating condition or environment.

After the signals 410/430 have been offset and/or scaled, an estimated angular position 499 of the rotor shaft may be determined according to the following recursive relationships:

$$\text{sin\_error}(i) = HED1\_Sin * \cos(\text{pos\_est}(i-1)*n/2) - HED2\_Cos * \sin(\text{pos\_est}(i-1)*n/2); \text{ and}$$

$$\text{pos\_est}(i) = \text{sin\_error}(i)\left[\frac{K_1 + K_1 K_2 s}{s^2}\right],$$

where sin_error(i) 465 represents the product and difference between: (1) the offset and scaled incoming sine and cosine signals 425/445 and (2) the estimated sine and cosine signals which are based on the previous position estimate (pos_est(i−1)) 496/493 respectively; pos_est(i) 499 is the determined angular position of the rotor shaft, n is the number of magnetic poles from which the sensor module produces a signal, $K_1$ 470 is a first constant, $K_2$ 485 is a second constant, s is the Laplace operator for the time derivative (d/dt), 1/s 475/480 is the Laplace operator for the integral, and i is the iteration number.

Variations on a recursive frequency domain function may be suitably implemented to determine the angular position 499, angular velocity, and/or angular acceleration of the rotor shaft without departing from the scope of the present invention. For example, while the Laplace transformation of the present invention employs a specified relationship between the Laplacian operators and a plurality of constants, other Laplace transformations may be employed to achieve any suitable result. As a further example, while the present invention manipulates the output of two HEDs, the output of three or more HEDs may be manipulated via a recursive frequency domain function in accordance with various representative embodiments of the present invention.

In one exemplary embodiment, sin_error 465 and pos_est 499 may be determined in accordance with the system generally depicted in FIG. 4 to produce a determination of the angular position, angular velocity, and/or angular acceleration of the rotor shaft. In response to this determination 499, the control system may be configured to modify an actuation input to selectively rotate the rotor shaft.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprising", "having", "including", or any contextual variant thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A system for measuring the angular orientation of a rotor, said system comprising:

a rotor assembly comprising a plurality of annularly disposed motor field pole magnetic domains;

a sensor module having at least two HEDs disposed at a specified relative angular separation with respect to each other, wherein the sensor module is suitably configured to produce a plurality of input signals in response to magnetic flux variation corresponding to axial rotation of the motor field pole magnetic domains; and a position measurement module suitably configured to:

process said input signals to produce converted sinusoidal reference signals, wherein said sinusoidal reference signals have at least one of an offset scale factor and an amplitude scale factor;

determine an error term by processing said converted reference signals to produce a position estimate signal corresponding to an approximate measurement of angular orientation of the rotor; and subsequently produce a refined measurement of angular orientation of the rotor by processing the error term.

2. The system of claim 1, wherein the production of a refined measurement of angular orientation comprises iterative elimination of regressive differences between a plurality of angular orientation estimates.

3. The system of claim 1, wherein the rotor is suitably configured to rotate in response to actuation of at least two motor field pole magnetic domains.

4. The system of claim 3, wherein the normal vector corresponding to the transverse surface of the magnetic domains is substantially coincident with the rotational axis of the rotor.

5. The system of claim 3, wherein at least two HEDs are arranged annularly with respect to the principal axis such that the HED signals produced are sinusoidal and out of phase by 90 degrees with respect to one another.

6. The system of claim 1, wherein:

the converted sinusoidal signals HED1_Sin, HED2_Cos) are produced in accordance with:

$$HED1\_Sin = (HED1\_V - B1) * X1 \text{ and}$$

$$HED2\_Cos = (HED2\_V - B2) * X2;$$

the error term (sin_error) is produced in accordance with:

$$\text{sin\_error} = HED1\_Sin * \cos(\text{pos\_est}(i-1)*n/2) - HED2\_Cos * \sin(\text{pos\_est}(i-1)*n/2);$$

and the position estimate (pos_est(i)) is produced in accordance with:

$$\text{pos\_est}(i) = \text{sin\_error}(i) * \left[ \frac{K_1 + K_1 K_2 s}{s^2} \right].$$

7. The system of claim 6, wherein the position measurement module determines at least one of angular acceleration and angular velocity of the rotor by processing the position estimate (pos_est(i)).

8. The system of claim 6, wherein the value of at least one of X1, X2, B1, and B2 is adaptively identified.

9. The system of claim 1, further comprising a control module responsive to the position measurement module, wherein the control module is suitably configured to actuate at least two motor field pole magnetic domains for angular positioning of the rotor.

10. A method for measuring the angular orientation of a rotor, said method comprising the steps of:
providing a rotor assembly comprising a plurality of annularly disposed motor field pole magnetic domains;
providing a sensor module having at least two HEDs disposed at a specified relative angular separation with respect to each other, wherein the sensor module is suitably configured to produce a plurality of input signals in response to magnetic flux variation corresponding to axial rotation of the motor field pole magnetic domains; and
providing a position measurement module suitably configured for:
processing said input signals to produce converted sinusoidal reference signals, wherein said sinusoidal reference signals have at least one of an offset scale factor and an amplitude scale factor;
determining an error term by processing said converted reference signals to produce a position estimate signal corresponding to an approximate measurement of angular orientation of the rotor; and
subsequently producing a refined measurement of angular orientation of the rotor by processing the error term.

11. The method of claim 10, wherein the production of a refined measurement of angular orientation comprises iterative elimination of regressive differences between a plurality of angular orientation estimates.

12. The method of claim 10, wherein the rotor is suitably configured to rotate in response to actuation of at least two motor field pole magnetic domains.

13. The method of claim 10, wherein the normal vector corresponding to the transverse surface of the magnetic domains is substantially coincident with the rotational axis of the rotor.

14. The method of claim 10, wherein at least two HEDs are arranged annularly with respect to the principal axis of the rotor at such that the HED signals produced are sinusoidal and out of phase by 90 degrees with respect to one another.

15. The method of claim 10, wherein:
the converted sinusoidal signals (HED1_Sin, HED2_Cos) are produced in accordance with:

$HED1\_Sin = (HED1\_V - B1) * X1$ and $HED2\_Cos = (HED2\_V - B2) * X2;$ the error term (sin_error) is produced in accordance with:

$\text{sin\_error} = HED1\_Sin * \cos(\text{pos\_est}(i-1) * n/2) - HED2\_Cos * \sin(\text{pos\_est}(i-1) * n/2);$ and the position estimate (pos_est(i)) is produced in accordance with:

$$\text{pos\_est}(i) = \text{sin\_error}(i) * \left[ \frac{K_1 + K_1 K_2 s}{s^2} \right].$$

16. The method of claim 15, wherein the position measurement module determines at least one of angular acceleration and angular velocity of the rotor by processing the position estimate (pos_est(i)).

17. The method of claim 15, wherein the value of at least one of X1, X2, B1, and B2 is adaptively identified.

18. The method of claim 10, further comprising the step of providing a control module responsive to the position measurement module, wherein the control module is suitably configured to actuate at least two motor field pole magnetic domains for angular positioning of the rotor.

19. A method for controlling an electric motor, said method comprising the steps of:
providing a rotor assembly comprising a plurality of annularly disposed motor field pole magnetic domains;
providing a sensor module having at least two HEDs disposed at a specified relative angular separation with respect to each other, wherein the sensor module is suitably configured to produce a plurality of input signals in response to magnetic flux variation corresponding to axial rotation of the motor field pole magnetic domains;
providing a position measurement module suitably configured for:
processing said input signals to produce converted sinusoidal reference signals, wherein said sinusoidal reference signals have at least one of an offset scale factor and an amplitude scale factor;
determining an error term by processing said converted reference signals to produce a position estimate signal corresponding to an approximate measurement of angular orientation of the rotor; and
subsequently producing a refined measurement of angular orientation of the rotor by processing the error term; and
providing a control module responsive to the position measurement module, wherein the control module is suitably configured to actuate at least two motor field pole magnetic domains for angular positioning of the rotor.

20. The method of claim 19, wherein the production of a refined measurement of angular orientation comprises iterative elimination of regressive differences between a plurality of angular orientation estimates.

21. The method of claim 19, wherein at least two HEDs are arranged annularly with respect to the principal axis of the rotor at such that the HED signals produced are sinusoidal and out of phase by 90 degrees with respect to one another.

22. The method of claim 19, wherein:
the converted sinusoidal signals (HED1_Sin, HED2_Cos) are produced in accordance with:

$HED1\_Sin = (HED1\_V - B1) * X1$ and $HED2\_Cos = (HED2\_V - B2) * X2;$ the error term (sin_error) is produced in accordance with:

sin_error=$HED1\_Sin*\cos(pos\_est(i-1)*n/2)-HED2\_Cos*\sin(pos\_est(i-1)*n/2)$;

and the position estimate (pos_est(k)) is produced in accordance with:

$$\text{pos\_est}(i) = \text{sin\_error}(i) * \left[ \frac{K_1 + K_1 K_2 s}{s^2} \right].$$

23. The method of claim 22, wherein the value of at least one of X1, X2, B1, and B2 is adaptively identified.

* * * * *